United States Patent
Lee et al.

(10) Patent No.: US 12,306,084 B2
(45) Date of Patent: May 20, 2025

(54) METHOD FOR ANALYZING SILICON CONCENTRATION IN PHOSPHORIC ACID SOLUTION

(71) Applicant: SEMIBOOSTER CO., LTD., Gyeongsangbuk-do (KR)

(72) Inventors: Seung Hun Lee, Daegu (KR); Seung Hyun Lee, Daegu (KR)

(73) Assignee: SEMIBOOSTER CO., LTD., Gyeongsangbuk-do (KR)

( * ) Notice: Subject to any disclaimer, the term of this patent is extended or adjusted under 35 U.S.C. 154(b) by 832 days.

(21) Appl. No.: 17/299,070

(22) PCT Filed: Nov. 11, 2019

(86) PCT No.: PCT/KR2019/015261
§ 371 (c)(1),
(2) Date: Jun. 2, 2021

(87) PCT Pub. No.: WO2020/138709
PCT Pub. Date: Jul. 2, 2020

(65) Prior Publication Data
US 2022/0146395 A1    May 12, 2022

(30) Foreign Application Priority Data
Dec. 24, 2018 (KR) .................. 10-2018-0168622

(51) Int. Cl.
G01N 15/06    (2024.01)

(52) U.S. Cl.
CPC ..... G01N 15/06 (2013.01); G01N 2015/0687 (2013.01)

(58) Field of Classification Search
None
See application file for complete search history.

(56) References Cited

U.S. PATENT DOCUMENTS

| | | | | |
|---|---|---|---|---|
| 4,060,586 A * | 11/1977 | Sardisco | ................. | C01B 25/22 423/321.1 |
| 4,136,151 A * | 1/1979 | Beaumont | ........... | C01B 25/2208 423/157.4 |
| 4,547,322 A * | 10/1985 | Fukuoka | ............... | C07C 269/06 560/345 |
| 4,552,974 A * | 11/1985 | Fukuoka | ............... | C07C 271/06 560/21 |
| 4,826,986 A * | 5/1989 | Huser | ................ | C07D 215/233 546/171 |
| 5,134,143 A * | 7/1992 | Huser | .................. | C07D 471/04 546/171 |
| 7,351,349 B2 | 4/2008 | Shekel et al. | | |
| 8,008,087 B1 * | 8/2011 | Shalyt | ................ | G01N 27/4166 436/124 |
| 2003/0075272 A1 * | 4/2003 | Ottow | ............... | H01L 21/31111 156/345.15 |
| 2004/0200806 A1 * | 10/2004 | Izuta | ........................ | C23F 1/46 216/99 |
| 2017/0062231 A1 * | 3/2017 | Sato | .................. | H01L 21/30608 |
| 2017/0313643 A1 * | 11/2017 | Juhász | .................... | C07C 45/65 |
| 2018/0286718 A1 * | 10/2018 | Konishi | ............ | H01L 21/67173 |

FOREIGN PATENT DOCUMENTS

| | | |
|---|---|---|
| CN | 1892216 A | 1/2007 |
| CN | 101303976 A | 11/2008 |
| EP | 1724824 A2 | 11/2006 |
| JP | 3788985 B2 | 6/2006 |
| JP | 2009-058306 A | 3/2009 |
| JP | 2011-203252 A | 10/2011 |
| JP | 2013-021066 A | 1/2013 |

* cited by examiner

*Primary Examiner* — Brian R Gordon
(74) *Attorney, Agent, or Firm* — NKL Law; Jae Youn Kim

(57) ABSTRACT

The present invention relates to a method of determining the concentration of silicon based on the solubility of silicon in a phosphoric acid solution to determine the concentration of silicon generated in the process of etching silicon nitride. The silicon concentration determination method can determine the concentration of only the silicon that is generated during a process of etching silicon nitride using a phosphoric acid solution. The method optically determines the concentration of a silicon compound that is added to increase selectivity.

1 Claim, No Drawings

METHOD FOR ANALYZING SILICON CONCENTRATION IN PHOSPHORIC ACID SOLUTION

TECHNICAL FIELD

The present invention relates to a method of determining the concentration of silicon present in a phosphoric acid solution. More particularly, the present invention relates to a method of determining the concentration of silicon in a phosphoric acid solution used to etch silicon nitride ($Si_3N_4$).

BACKGROUND ART

The present invention relates to a method of determining the concentration of silicon in a phosphoric acid solution used to etch silicon nitride ($Si_3N_4$).

In the past, silicon nitride was etched with only a phosphoric acid solution. Therefore, the concentration of silicon in the solution was not so important. However, with the 3D NAND process recently emerging, the selectivity between silicon nitride ($Si_3N_4$) and silicon oxide ($SiO_2$) has become important.

Since the selectivity between silicon nitride and silicon oxide is influenced by the concentration of silicon in an etching solution, the concentration of silicon in the etching solution is considered important. By measuring and determining the concentration of silicon, not only can the selectivity be determined, but also the time point at which silicon oxide is not etched can be detected. Therefore, the measurement and analysis of the silicon concentration is important.

As a method of determining the concentration of silicon in a pure phosphoric acid solution, U.S. Pat. No. 7,351,349, EP 1724824 A2, and U.S. Pat. No. 8,008,087 each discloses a fluorine concentration determination method.

However, the disclosed methods are only suitable for analysis of a silicon concentration in a phosphoric acid solution that does not require a high selectivity between silicon nitride and silicon oxide.

On the other hand, in the 3D NAND process, a silicon compound is added to a phosphoric acid solution to increase the selectivity between silicon nitride and silicon oxide. In this case, the added silicon compound is dissolved in the solution. Therefore, there is a problem in that the existing analysis method cannot distinguish silicon originating in the silicon compound intentionally added to the phosphoric acid solution from silicon that is generated during etching of silicon nitride.

In addition, since the amount of silicon added to the solution to increase the selectivity is relatively large compared to the amount of silicon generated during etching, the reliability of the concentration analysis of silicon generated during etching is significantly low.

EP 1724824 A2 is a literature of a related art.

DISCLOSURE

Technical Problem

The present invention relates to a method of determining the concentration of silicon that is generated during etching and is present in a phosphoric acid solution containing a silicon compound that is added to increase selectivity between silicon nitride (Si3N4) and silicon oxide (SiO2).

The present invention also relates to a method of determining the concentration of silicon produced through a process in which silicon nitride is etched with a pure phosphoric acid solution.

Technical Solution

In order to accomplish the objective, the present invention provides a method of determining the concentration of silicon generated during a process in which silicon nitride is etched, the method including: diluting, with a solvent, a pure phosphoric acid solution used to silicon nitride and an impure phosphoric acid solution to which a silicon compound is added to increase selectivity; cooling the pure phosphoric acid solution to a temperature range of 1° C. to 35° C. so that only a silicon compound that is generated during the process of etching the silicon nitride precipitates; and determining the concentration of silicon generated through the etching of the silicon nitride by analyzing the precipitate with a particle analyzer or by dissolving the precipitate with hydrofluoric acid.

In the past, silicon nitride was etched with only a phosphoric acid solution. Therefore, the concentration of silicon in the solution was not so important. However, with the 3D NAND process recently emerging, the selectivity between silicon nitride ($Si_3N_4$) and silicon oxide ($SiO_2$) has become important.

Since the selectivity between silicon nitride and silicon oxide is influenced by the concentration of silicon in an etching solution, the concentration of silicon in the etching solution is considered important. By measuring and determining the concentration of silicon, not only can the selectivity be determined, but also the time point at which silicon oxide is not etched can be detected. Therefore, the measurement and analysis of the silicon concentration is important.

Advantageous Effects

The silicon concentration analysis method of the present invention has an effect of not only determining the concentration of only the silicon generated through a phosphoric acid etching process for etching silicon nitride but also optionally determining the concentration of a silicon compound that is added to increase selectivity between silicon nitride and silicon oxide.

BEST MODE

Hereinafter, the present invention will be described in detail.

The present invention relates to a method of analyzing the concentration of silicon in a phosphoric acid solution and will be described in detail below with reference to examples.

Examples are illustratively described using specific numerical values to help understanding the present invention, and the presented specific numerical values are selected only for description within a critically significant technical scope. Thus, the specific numerical values should not be understood as limiting the technical scope of the present invention.

Table 1 below shows values representing silicon concentration depending on temperature.

TABLE 1

| temperature (° C.) | Si concentration (ppm) |
|---|---|
| 25 | 50 |
| 50 | 60 |
| 70 | 70 |

TABLE 1-continued

| temperature (° C.) | Si concentration (ppm) |
|---|---|
| 100 | 90 |
| 150 | 120 |

As shown by the silicon solubility values of Table 1, in the case of silicon produced in the process of etching silicon nitride, only a predetermined amount of silicon is dissolved when a phosphoric acid solution is at a specific temperature.

A supersaturated silicon compound precipitates as particles, and the particles are analyzed with a particle analyzer.

In a silicon nitride etching process, when silicon particle analysis is performed by lowering the temperature of a phosphoric acid solution to determine the silicon concentration, it is difficult to accurately determine the concentration of silicon because silicon particles remain on the wall along which the phosphoric acid solution flows.

To solve this problem, the phosphoric acid solution is diluted with a solvent so that the precipitated particles can be well dispersed in the solvent. Since the dilution ratio varies depending on the sensitivity of a particle size analyzer, the dilution ratio is not particularly limited in the present invention, but the dilution ratio in which 50 to 100 parts by weight of the solvent is added to 100 parts by weight of the phosphoric acid solution is preferable.

In the case of a phosphoric acid solution in which a silicon compound is stably dissolved to increase the ratio of etching rates of silicon nitride and silicon oxide (i.e., etching selectivity between silicon nitride and silicon oxide), since the silicon compound is very stably dissolved in the phosphoric acid solution, even though the phosphoric acid solution is cooled after the silicon nitride is etched, the silicon compound that is initially dissolved in the phosphoric acid solution does not precipitate, and only silicon generated during the etching precipitates. Therefore, regardless of the concentration of the silicon compound added to increase the selectivity between silicon nitride ($Si_3N_4$) and silicon oxide ($SiO_2$), only the concentration of silicon produced during the etching is detected.

In addition, in the case where the concentration of the silicon compound added to the phosphoric acid solution to increase the selectivity between silicon nitride ($Si_3N_4$) and silicon oxide (SiO2) is confirmed, it is possible to determine the concentration of silicon generated during the etching using the method of the present invention. When diluting a phosphoric acid solution to which a silicon compound is added to be stably dissolved to increase the selectivity between silicon nitride ($Si_3N_4$) and silicon oxide (SiO2), a mixture of distilled water and a solvent may be used to dilute the phosphoric acid solution. In the case of adding distilled water to the solvent, it is preferable to mix 50 to 100 parts by weight of distilled water with 100 parts by weight of the solvent.

In addition, to determine the concentration of the precipitated silicon compound, the precipitated silicon compound may be dissolved with a fluorine compound solution. When dissolving the precipitated silicon compound in the fluorine compound solution, 100 parts by weight of the fluorine compound solution is preferably mixed with 50 to 100 parts by weight of the precipitated silicon compound.

Since the silicon compound stably present in a phosphoric acid solution is precipitated when meeting distilled water, the amount of the precipitated silicon can be determined in the same manner described above.

After etching a silicon nitride wafer with a phosphoric acid solution, the exact silicon concentration was measured through inductively coupled plasma optical emission spectroscopy (ICP-OES).

One half of a 300 mm wafer on which a silicon nitride film with a thickness of 1000 to 5000 Å is deposited is etched with a phosphoric acid solution at a temperature in a range of 20° C. to 180° C. In this case, the silicon concentration measured by ICP-OES was 50 to 150 ppm. The phosphoric acid solution was diluted with ethanol in a dilution ratio of 1:0.5 to 1. The silicon concentration was measured at a temperature in a range of 20° C. to 30° C. through ICP-OES. Since the silicon is precipitated, the silicon is not detected in the phosphoric acid during the measurement performed after the phosphoric acid solution is diluted with ethanol.

As shown in Table 1, silicon concentration in a phosphoric acid solution was measured at various temperatures. As a result, the silicon concentration was 50 ppm when measured at 25° C., 60 ppm at 50° C., 70 ppm at 70° C., 90 ppm at 100° C., and 120 ppm at 150° C.

The phosphoric acid solutions that contain 0 ppm, 50 ppm, 100 ppm, 150 ppm, and 200 ppm of silicon nitride, respectively after the silicon nitride etching were diluted with ethanol in a dilution ratio of 50:0.5 to 30. After that, 0.5 μm particles were detected with a liquid particle counter (LPC). The used liquid particle counter was KE-40 manufactured by Rion Co., Ltd.

MODE FOR INVENTION

Example

A silicon nitride wafer was etched with a phosphoric acid solution, the exact silicon concentration in the phosphoric acid solution was measured through ICP-OES.

One half of a 300 mm wafer on which a silicon nitride film with a thickness of 4000 Å is deposited was etched with a phosphoric acid solution at a temperature of 160° C. In this case, the silicon concentration measured by ICP-OES was 100 ppm. After the phosphoric acid solution was diluted with ethanol in a dilution ratio of 1:1, the silicon concentration measured at a temperature of 25° C. through ICP-OES was 25 ppm. The silicon in an amount of 50 ppm was precipitated in the phosphoric acid solution. Thus, after the phosphoric acid solution was diluted with ethanol, the silicon corresponding to the amount of 50 ppm was not detected.

The invention claimed is:

1. A method of determining a concentration of precipitated silicon
the method comprising:
adding a silicon compound to a phosphoric acid solution;
etching a silicon nitride film deposited on a wafer with the phosphoric acid solution including the silicon compound, wherein the phosphoric acid solution including the silicon compound is at a temperature in a range of 100° C. to 180° C., wherein the silicon nitride film has a thickness of 1000 to 5000 A, and etching of the silicon nitride film generates silicon that is contained within the phosphoric acid solution;
cooling the phosphoric acid solution containing the generated silicon to a temperature range of 1° C. to 35° C. and diluting the phosphoric acid solution with a solvent which is ethanol, such that the phosphoric acid solution and ethanol are mixed so as to be in a ratio of 1:0.5 to 1, to thereby precipitate the generated silicon in the phosphoric acid solution;

dissolving the precipitated silicon by mixing 100 parts by weight of a fluorine compound solution with 50 to 100 parts by weight of the precipitated silicon; and determining the concentration of the precipitated silicon through inductively coupled plasma optical emission spectroscopy (ICP-OES).

\* \* \* \* \*